United States Patent [19]

Kim et al.

[11] Patent Number: 4,851,775
[45] Date of Patent: Jul. 25, 1989

[54] DIGITAL COMPASS AND MAGNETOMETER HAVING A SENSOR COIL WOUND ON A HIGH PERMEABILITY ISOTROPIC CORE

[75] Inventors: Nam H. Kim, Glendale; Timothy Hawks, Stanford, both of Calif.

[73] Assignee: Precision Navigation, Incorporated, Menlo Park, Calif.

[21] Appl. No.: 69,495

[22] Filed: Jul. 2, 1987

[51] Int. Cl.$^4$ .......................................... G01R 33/02
[52] U.S. Cl. .................................... 324/247; 324/260
[58] Field of Search ............... 324/244, 247, 249, 252, 324/253, 254, 255, 256, 260; 331/65

[56] References Cited

U.S. PATENT DOCUMENTS

| | | | |
|---|---|---|---|
| 3,416,072 | 12/1968 | Fussell et al. | 324/249 |
| 3,936,949 | 2/1976 | Devaud | 324/247 |
| 4,182,987 | 1/1980 | Moeller | 324/249 |
| 4,241,317 | 12/1980 | Breitling | 331/65 |
| 4,305,034 | 12/1984 | Long et al. | 324/253 |

Primary Examiner—Reinhard J. Eisenzopf
Assistant Examiner—Walter E. Snow
Attorney, Agent, or Firm—Joseph H. Smith

[57] ABSTRACT

A digital compass (20) has a sensing coil (60) wound on an elongated strip of high direct current permeability magnetic material. The sensing coil (60) is connected to a sensing circuit (56). The sensing coil and sensing circuit are responsive to the Earth's magnetic field to provide an oscillating signal at an output (28) of the sensing circuit (56) which varies in frequency with orientation of the at least one sensing coil (60) with respect to the Earth's magnetic field. A microprocessor (36) is connected to receive information inputs from the oscillating signal. The microprocessor converts the information inputs to an indication of orientation of the sensing coil with respect to the Earth's magnetic field based on the frequency of the oscillating signal. A display (52) receives the orientation indication from the microprocessor.

17 Claims, 1 Drawing Sheet

DIGITAL COMPASS AND MAGNETOMETER HAVING A SENSOR COIL WOUND ON A HIGH PERMEABILITY ISOTROPIC CORE

BACKGROUND OF THE INVENTION

1. Field of the Invention

This invention relates to a digital compass in which direction of the Earth's magnetic field is determined on the basis of frequency differences which are a function of the orientation of the digital compass with respect to the Earth's magnetic field. More particularly, it relates to such a digital compass in which it is not necessary to convert analog signals to digital signals. It further relates to a novel form of a magnetometer which has general application for determining orientation of weak magnetic fields based on frequency differences.

2. Description of the Prior Art

A variety of digital compasses and magnetometers are known in the art. For example, U.S. Pat. No. 3,396,329, issued Aug. 6, 1968 to Salvi, discloses a magnetometer in which the intensity of weak magnetic fields is a function of frequency difference in sensed signals, but independent of orientation of a vessel in which the magnetometer is installed. U.S. Pat. No. 3,634,946, issued Jan. 18, 1972 to Star, relates to an all digital circuit implementation of a digital compass which operates on the basis of spatial relationships of pulses produced when a sensor is aligned in a reference direction and orthogonal to the Earth's magnetic field. There is no mention in this patent of frequency differences created by orientation, nor does the circuit shown discriminate on the basis of such frequency differences. U.S. Pat. No. 4,305,034, issued Dec. 8, 1981 to Long et al., discloses a magnetometer in which frequency changes are created when a background magnetic field, which can be the Earth's magnetic field, is perturbed by a metal object, but this device cannot provide sign information, i.e., whether the field is parallel or antiparallel to the sensor coil. U.S. Pat. No. 4,340,861, issued July 20, 1982 to Sparks, discloses a magnetometer in which frequency differences are used to determine distribution of magnetic fields produced by permanent magnets, on the basis of amplitude information in the different frequency signals. U.S.S.R. Pat. No. 945,835, issued July 27, 1982 to Bondarevsk et al., discloses that a strong magnetic field will produce frequency differences in an LC circuit.

The following additional issued U.S. patents relate to digital compasses which utilize phase differences, comparison with previous signals at known orientations or counting of sensing marks to determine orientation: No. 3,490,024, issued Jan. 13, 1970 to Sherrill et al.; No. 3,903,610, issued Sept. 9, 1970 to Heaviside et al.; No. 3,952,420, issued Apr. 27, 1976 to Benjamin et al.; No. 4,095,348, issued June 20, 1978 to Kramer; No. 4,179,741, issued Dec. 18, 1979 to Rossani; No. 4,424,631, issued Jan. 10, 1984 to Franks and No. 4,640,016, issued Feb. 3, 1987 to Tanner et al. The following issued U.S. patents relate generally to magnetometers: No. 3,432,751, issued Mar. 11, 1969 to Godby et al.; No. 3,435,337, issued Mar. 25, 1969 to Inouye et al., No. 3,461,387, issued Aug. 12, 1969 to Morris et al., No. 3,768,011, issued Oct. 23, 1973 to Swain and No. 4,641,094, issued Feb. 3, 1987 to Dalton, Jr. The state of the art in magnetometer design is further indicated by Takeuchi et al., "A Resonant-Type Amorphous Ribbon Magnetometer Driven by an Operational Amplifier," *IEEE Transactions on Magnetics*, Vol. MAG-20, No. 5, September 1984, pp. 1723–1725.

While the art relating to the design of digital compasses and magnetometers is thus a well-developed one, a need remains for development of a simple, reliable, low cost digital compass suitable for consumer use and a simple magnetometer for determining orientation of low intensity magnetic fields.

SUMMARY OF THE INVENTION

Accordingly, it is an object of this invention to provide a digital compass which can be implemented with a simple digital circuit and which is sufficiently low cost for consumer applications.

It is another object of the invention to provide such a digital compass in which orientation with respect to the Earth's magnetic field is determined by frequency differences obtained with a sensing circuit.

The attainment of these and related objects may be achieved through use of the novel digital compass herein disclosed. A digital compass in accordance with this invention has at least one sensing coil wound on an elongated strip of high direct current permeability magnetic material. The sensing coil is connected to a sensing circuit. The at least one sensing coil and sensing circuit are responsive to the Earth's magnetic field to provide an oscillating signal at an output of the sensing circuit which varies in frequency with orientation of the at least one sensing coil with respect to the Earth's magnetic field. A microprocessor is connected to receive information inputs from the oscillating signal. The microprocessor is configured to convert the information inputs to an indication of orientation of the at least one sensing coil with respect to the Earth's magnetic field based on the frequency of the oscillating signal. A display means is connected to receive the orientation indication from the microprocessor.

The frequency of the oscillating signal at the output of the sensing circuit varies substantially, e.g., by about 100 percent, as the sensing coil is moved from a parallel to an antiparallel orientation with respect to the Earth's magnetic field. Such substantial frequency differences mean that a very accurate digital readout of angle between the sensing coil orientation and magnetic North is obtained from the microprocessor.

Similarly, a magnetometer in accordance with the invention has at least one sensing coil wound on an elongated strip of high direct current permeability magnetic material. The sensing coil is connected to a sensing circuit. The at least one sensing coil and sensing circuit are responsive to a magnetic field to provide an oscillating signal at an output of the first sensing circuit which varies in frequency with orientation of the at least one sensing coil with respect to the magnetic field. The sensing coil is connected to be self-biased by a direct current through the sensing coil. A means for measuring a frequency of the oscillating signal and providing an indication of the frequency is connected to receive the oscillating signal.

The attainment of the foregoing and related objects, advantages and features of the invention should be more readily apparent to those skilled in the art, after review of the following more detailed description of the invention, taken with the drawings, in which:

DETAILED DESCRIPTION OF THE INVENTION

Figure 1:
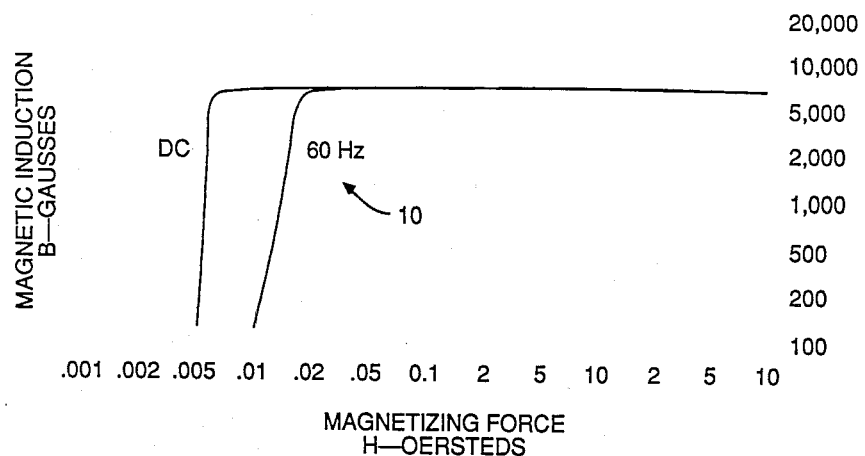
FIG. 1 is a hysteresis curve for a sensing element used in a digital compass in accordance with the invention.

Turning now to the drawings, more particularly to FIG. 1, there is shown a hysteresis curve 10 for an isotropic material such as METGLAS Amorphous Alloy 2705 M, obtainable from Allied Signal Corporation. This material is a cobalt-based magnetic alloy which is characterized by near-zero magnetostriction and high DC-permeability without annealing. This material is used to form sensors for the digital compass of this invention by winding a coil around a straight strip of the alloy in a traditional solenoid geometry.

The following background information will facilitate an understanding of the invention. For magnetic core solenoids, the following equations are generally true.

$$H = \mu_0 n I \quad (1),$$

where H is the magnetizing force, n is the turn density of the coil in turns per unit length, $\mu_0$ is the permeability of free space, and I is the current flowing in the coil.

$$E = nV(dB/dt) \quad (2)$$

where E is the potential across the coil in volts, n is the turn density in turns per unti length, V is the volume of the core material, and dB/dt is the time derivative of the total magnetic flux.

For small transitions or changes in H, the coil can be modeled as an ideal inductor, where $$E = L(dI/dt) \quad (3)$$

By substitution of the previous equations and by solving, the following can be shown $$L = \mu_0 n^2 V(dB/dH) \quad (4)$$

where dB/dH is the slope of the B vs. H curve at a particular point.

Figure 2:
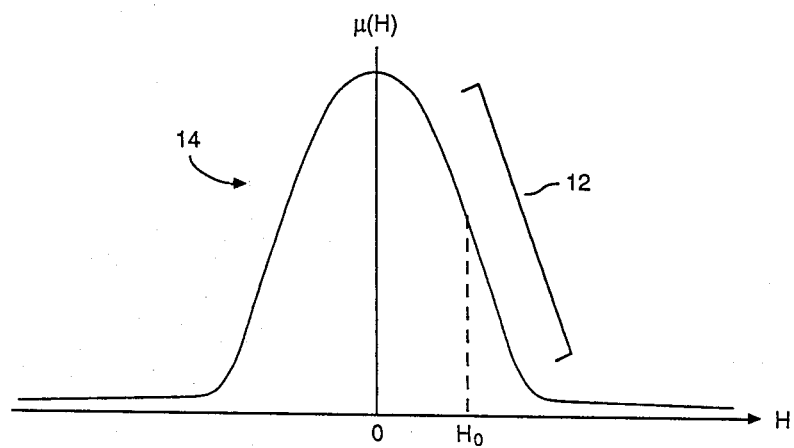
FIG. 2 is a plot useful for understanding operation of the invention.

Let $\mu(H) = dB/dH$. While most magnetic core materials exhibit a constant $\mu$ over a large range of H, the above METGLAS alloy has uniquely different characteristics, as shown by the $\mu(H)$ plot of FIG. 2. As shown, by providing a dc bias current through the coil, producing a magnetizing force $H_0$, the coil can be biased at an operating point which is in the middle of sloping region 12 of $\mu(H)$ curve 14. A static magnetic field parallel to the coil will be added to the $H_0$ and will move the operating point in either direction dependent on the polarity of the static magnetic field. Since the inductance L is proportional to $\mu(H)$, the inductance will change appreciably with the applied static magnetic field.

Figure 3:
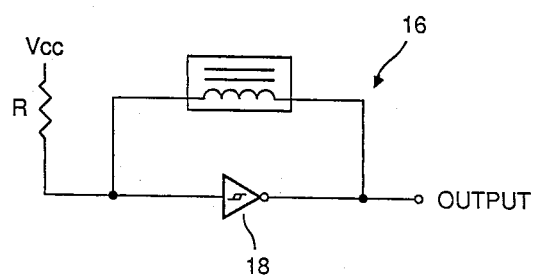
FIG. 3 is a schematic diagram of a sensing circuit used in a digital compass in accordance with the invention.

The above principles of induction variation can be observed with a relaxation oscillator sensing circuit 16 using a Schmitt trigger 18 as shown in FIG. 3. The period of the output, T, is proprtional to L/R. The dc bias current is dependent on R and the threshold levels of the Schmitt trigger 18. In general, by using the sensor as the inductor timing element of any oscillator circuit, a change in the static field will produce a frequency change at the output. The duty cycle should be asymmetrical and will not vary significantly with the operating point in the linear region $\mu(H)$, i.e., the sloping portion 12 of the curve 14 in FIG. 2. Such a frequency change detection scheme renders an analog to digital (A/D) converter unnecessary. Note that the linearity of the $\mu(H)$ region is not essential to recover useful information; the operation region merely has to be monotonic.

Figure 4:
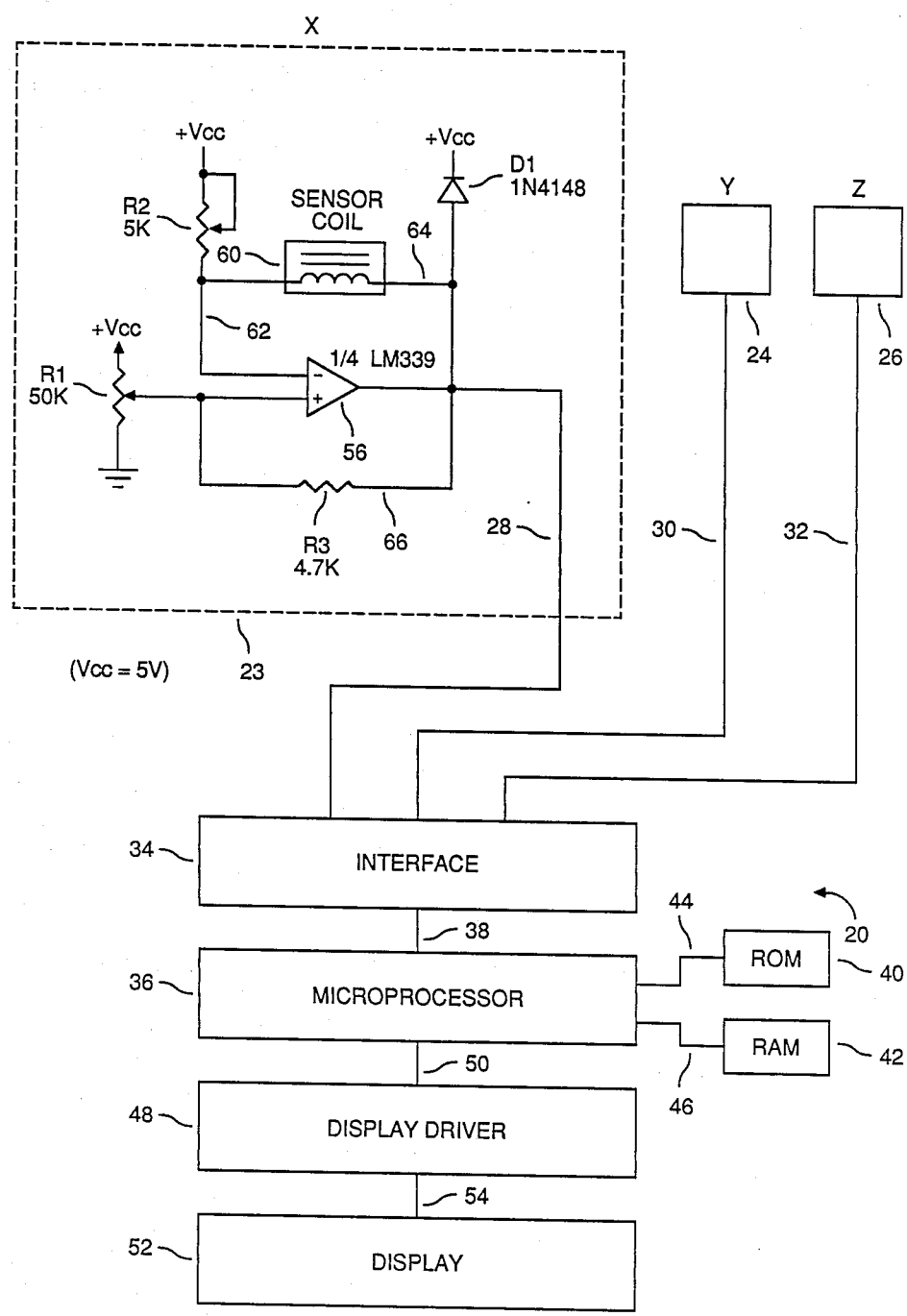
FIG. 4 is a block diagram of a digital compass in accordance with the invention.

FIG. 4 shows a digital compass 20 utilizing a sensing circuit 23 of the type shown in FIG. 3. The compass 20 has X, Y and Z sensors 23, 24 and 26 respectively connected by lines 28, 30 and 32 to an interface circuit 34. Interface circuit 34 is connected to microprocessor 36 by line 38. The microprocessor 36 is connected to a read only memory (ROM) 40 and to a random access memory (RAM) 42 by lines 44 and 46, respectively. The microprocessor 36 is connected to a display driver 48 by line 50. Display driver 48 is in turn connected to display 52 by line 54.

The X, Y and Z sensors 23, 24 and 26 each have the configuration shown for the X sensor 23. The X sensor 23 has a Schmitt trigger circuit 56 implemented with a LM 339 type voltage comparator integrated circuit, obtainable from National Semiconductor Corporation, Santa Clara, Calif. A +Vcc input is connected through a 50K ohm variable resistor R1 to the positive input of the Schmitt trigger 56 by line 58. A sensor coil 60 having 1200 turns of wire around a straight strip of METGLAS Amorphous Alloy 2705 M with a length of 1.8 cm, a width of 0.5 mm and a thickness of 20 $\mu$m is connected to the negative input of the Schmitt trigger 56 by line 62. A +Vcc input is also connected through a 5K variable resistor R2 to the negative input of the Schmitt trigger 56. The output of the Schmitt trigger 56 is connected by the line 28 to the interface circuit 34. The output of the Schmitt trigger is also fed back on line 64 through the sensor coil 60 to the input. The output is also connected to +Vcc through a 1N4148 type diode D1, and fed back on line 66 through a 4.7K resistor R3 to the positive input of the Schmitt trigger 56. The resistor R2 can be used to adjust both the bias current (and hence the operating point) and the frequency of the oscillator. R1 will change the location of the Schmitt trigger's positive and negative thresholds. R3 can be used to adjust the frequency and the current swing of the oscillator circuit.

In operation, as noted above, the period T of the oscillating output of the Schmitt trigger 56 is proportional to L/R at the input. The value of L varies with the orientation of the sensor coil 60 with respect to the Earth's magnetic field. Where $He''$ is the component of the Earth's magnetic field parallel to the length of the sensor 60 and $He''$ is taken to be positive along the direction of $H_0$, $He''$ can be very precisely determined by detecting frequency deviation. By having two sensors in orthogonal directions, such as x and y, $\theta$, the orientation angle of the magnetic North with respect to the fixed direction of the compass 20 can be determined according to the formula $$\theta = \text{Arctan}(He''y/He''x)$$

By having three sensor 23, 24 and 26, the orientation angle of magnetic North can be determined at any fixed direction of the compass 20 in three dimensions. With inclination information, we extract the two components He"y and He"x, which are parallel to the Earth's surface.

In practice, an oscillating center frequency $f_0$ of about 200 kHz is obtained with the sensors 23, 24 and 26. A frequency change of about 100% is obtained as one of the sensors 23, 24 and 26 is rotated from a parallel to an antiparallel direction with respect to the Earth's magnetic field. This magnitude of frequency change gives very accurate digital read out of orientation with the digital compass 20.

It should now be readily apparent to those skilled in the art that a novel digital compass capable of achieving the stated objects of the invention has been provided. The digital compass of this invention uses a simple digital circuit and is therefore of sufficiently low cost for consumer applications. The compass determines orientation with respect to the Earth's magnetic field based on frequency differences as the direction of a sensor changes with respect to the Earth's magnetic field. The sensor produces large enough frequency differences so that a very accurate digital read out of orientation is obtained.

It should further be apparent to those skilled in the art that various changes in form and details of the invention as shown and described may be made. It is intended that such changes be included within the spirit and scope of the claims appended hereto.

What is claimed is:

1. A magnetometer comprising:
   an oscillator circuit comprising:
      oscillator driver means having first and second terminals for providing an oscillating current; and
      sensor means having a first coil wound on a first high permeability isotropic core for controlling the frequency of said oscillator circuit, said first coil coupled between said first and second terminals, said first coil having a magnetic axis;
      said oscillator driver means for providing a DC bias current through said first coil, such that when said sensor means experiences a change in an externally applied magnetic field, the frequency of the oscillating current changes monotonically with the change in magnitude of the applied external magnetic field in the direction of the magnetic axis of said first coil; and
   measurement means for measuring the frequency of the oscillating current and providing a measurement signal in response thereto.

2. A magnetometer as in claim 1 wherein said oscillator driver means includes resistive means connected between a source of an electric potential and said sensor means for providing said DC bias current.

3. A magnetometer as in claim 1 wherein said measurement means comprises microprocessor means for providing said measurement signal such that said measurement signal is functionally related to the magnitude and sign of the externally applied magnetic field.

4. A magnetometer as in claim 3 further comprising display means coupled to receive said measurement signal from said microprocessor means for displaying a representation of the magnitude and sign of the externally applied magnetic field relative to the magnetic axis of said first coil.

5. A magnetometer as in claim 1 further comprising:
   a second oscillator circuit comprising:
      second oscillator driver means having first and second terminals for providing a second oscillating current; and
      second sensor means having a second coil wound on a second high permeability isotropic core for controlling the frequency of said second oscillator circuit, said second coil coupled between said first and second terminals of said second oscillator driver means, said second coil having a magnetic axis with a directional component orthogonal to the magnetic axis of the first coil;
      said second oscillator driver means for providing a DC bias current through said second coil, such that when said second sensor means experiences a change in the externally applied magnetic field, the frequency of the second oscillating current changes monotonically with the change in magnitude of the applied external magnetic field in the direction of the magnetic axis of said second coil; and
   wherein said measurement means includes means for measuring the frequency of the second oscillating current and providing a second measurement signal in response thereto.

6. A magnetometer as in claim 5 further comprising:
   a third oscillator circuit comprising:
      third oscillator driver means having first and second terminals for providing a third oscillating current; and
      third sensor means having a third coil wound on a third high permeability isotropic core for controlling the frequency of said third oscillator circuit, said third coil coupled between said first and second terminals of said third oscillator driver means, said third coil having a magnetic axis with a directional component orthogonal to the magnetic axis of the first coil and the magnetic axis of the second coil;
      said third oscillator driver means for providing a DC bias current through said third coil, such that when said third sensor means experiences a change in the externally applied magnetic field, the frequency of the third oscillating current changes monotonically with the change in magnitude of the applied external magnetic field in the direction of the magnetic axis of said third coil; and
   wherein said measurement means includes means for measuring the frequency of the third oscillating current and providing a third measurement signal in response thereto.

7. A magnetometer as in claim 1 wherein said high permeability material is a metallic glass alloy.

8. A magnetometer as in claims 6 wherein said first, second and third oscillator drivers comprise Schmitt trigger circuits.

9. A digital compass comprising:
   a first voltage comparator circuit having first and second input terminals, and a output terminal, said output terminal being coupled back to said second input terminal and said second input terminal being coupled to a first reference potential;
   a first sensing coil wound on a high permeability isotropic core having a magnetic axis and being connected between said first input terminal and said output terminal of said first voltage comparator circuit so as to form a first relaxation oscillator, said first relaxation oscillator providing a first oscillating signal having a frequency that is a monotonic function of the magnitude of the earth's local magnetic field in the direction of the magnetic axis of the first sensing coil; and processor means coupled to receive said oscillating signal from said first relaxation oscillator for providing an indicator signal representative of the orientation of the magnetic axis of said first sensing coil with respect to the direction of the earth's local magnetic field.

10. A digital compass as in claim 9 further comprising display means coupled to receive said indicator signal for displaying a signal related to the relative orientation of said first sensing coil with respect to the direction of the earth's local magnetic field.

11. A digital compass of claim 9 wherein:
said magnetic axis of said first sensing coil is the X axis; said digital compass further comprises:
 a second voltage comparator circuit having first and second input terminals, and an output terminal, with the second input terminal being connected to a second reference potential;
 a second sensing coil wound on a high permeability isotropic core having a magnetic axis, the Y axis, that is orthogonal to the X axis, said second sensing coil being connected between said first input terminal and said output terminal of said second relaxation oscillator, said second relaxation oscillator providing a second oscillating signal having a frequency that is a monotonic function of the magnitude of the earth's local magnetic field in the direction of the magnetic axis of the second sensing coil;
 a third voltage comparator circuit having first and second input terminals, and an output terminal, with the second input terminal being connected to a third reference potential; and
 a third sensing coil wound on a high permeability isotropic core having a magnetic axis, the Z axis, that is orthogonal to both the X and the Y axes, said third sensing coil being connected between said first input terminal and said output terminal of said third voltage comparator circuit so as to form a third relaxation oscillator, said third relaxation oscillator providing a third oscillating signal having a frequency that is a monotonic function of the magnitude of the earth's local magnetic field in the direction of the magnetic axis of the third sensing coil; and
 said processor means further coupled to receive said oscillating signals from said second and third relaxation oscillators for providing indicator signals representative of the orientation of the magnetic axis of said second and third sensing coils with respect to the direction of the earth's local magnetic field.

12. The digital compass of claim 11 wherein at least one of said first, second, and third voltage comparator circuits is a Schmitt trigger circuit.

13. A digital compass of claim 9 wherein said high permeability material is a metallic glass alloy.

14. A digital compass comprising the magnetometer of claim 6 and wherein said applied external magnetic field is the earth's magnetic field.

15. The digital compass of claim 9 wherein:
said magnetic axis of said first sensing coil is the X axis; said digital compass further comprising:
 a second voltage comparator circuit having first and second input terminals, and a output terminal, said output terminal of said second voltage comparator circuit being coupled back to said second input terminal of said second voltage comparator circuit;
 a second sensing coil having a magnetic axis, the Y axis, that is orthogonal to the X axis, said second sensing coil being connected between said first input terminal and said output terminal of said second voltage comparator circuit so as to form a second relaxation oscillator, said second relaxation oscillator providing a second oscillating signal having a frequency that is a monotonic function of the magnitude of the earth's local magnetic field in the direction of the magnetic axis of the second sensing coil; and
 said processor means further coupled to receive said second oscillating signal from said second relaxation oscillator for providing an indicator signal representative of the orientation of the magnetic axis of said second sensing coil with respect to the direction of the earth's local magnetic field.

16. The digital compass of claim 15 wherein at least one of said first and second voltage comparator circuits is a Schmitt trigger circuit.

17. The digital compass of claim 15 wherein said high permeability cores are constructed of a metallic glass alloy.

* * * * *